(12) United States Patent
Cummings

(10) Patent No.: US 6,809,500 B2
(45) Date of Patent: Oct. 26, 2004

(54) POWER SUPPLY APPARATUSES AND POWER SUPPLY OPERATIONAL METHODS

(75) Inventor: John Cummings, Round Rock, TX (US)

(73) Assignee: Valence Technology, Inc., Henderson, NV (US)

(*) Notice: Subject to any disclaimer, the term of this patent is extended or adjusted under 35 U.S.C. 154(b) by 89 days.

(21) Appl. No.: 10/353,189

(22) Filed: Jan. 28, 2003

(65) Prior Publication Data

US 2004/0145359 A1 Jul. 29, 2004

(51) Int. Cl.$^7$ .................. H01M 10/44; H01M 10/46
(52) U.S. Cl. ........................................... 320/128
(58) Field of Search .................. 320/127, 128, 320/134, 136, 137, 166

(56) References Cited

U.S. PATENT DOCUMENTS 4,360,772 A * 11/1982 Voss ...................... 322/28

OTHER PUBLICATIONS

U.S. patent Ser. No. 09/484,799: entitled "Lithium–based Active Materials and Preparation Thereof": Jeremy Barker: filed Jan. 18, 2000.

U.S. patent application Ser. No. 10/071,850, entitled "Electrical Power Source Apparatuses, Circuits, Electrochemical Device Charging Methods, and Methods of Charging a Plurality of Electrochemical Devices": John Cummings: filed Feb. 8, 2002.

* cited by examiner

Primary Examiner—Edward H. Tso
(74) Attorney, Agent, or Firm—Michael D. Ross; Roger A. Williams; Cynthia Kovacevic

(57) ABSTRACT

Power supply apparatuses and power supply operational methods are provided. According to one aspect, a power supply apparatus includes a power node, an electrochemical device configured to store electrical energy, a switch including a control node and the switch is adapted to electrically couple the electrochemical device with the power node in a conducting state and to substantially electrically isolate the electrochemical device and the power node in a nonconducting state, a controller configured to output a first control signal to control the operation of the switch between the conducting state and the nonconducting state and circuitry coupled with the controller and the control node and configured to receive electrical energy at a first voltage magnitude, to increase the electrical energy to a second voltage magnitude greater than the first voltage magnitude to provide a second control signal, and to output the control signal of the second voltage magnitude to the switch.

47 Claims, 2 Drawing Sheets

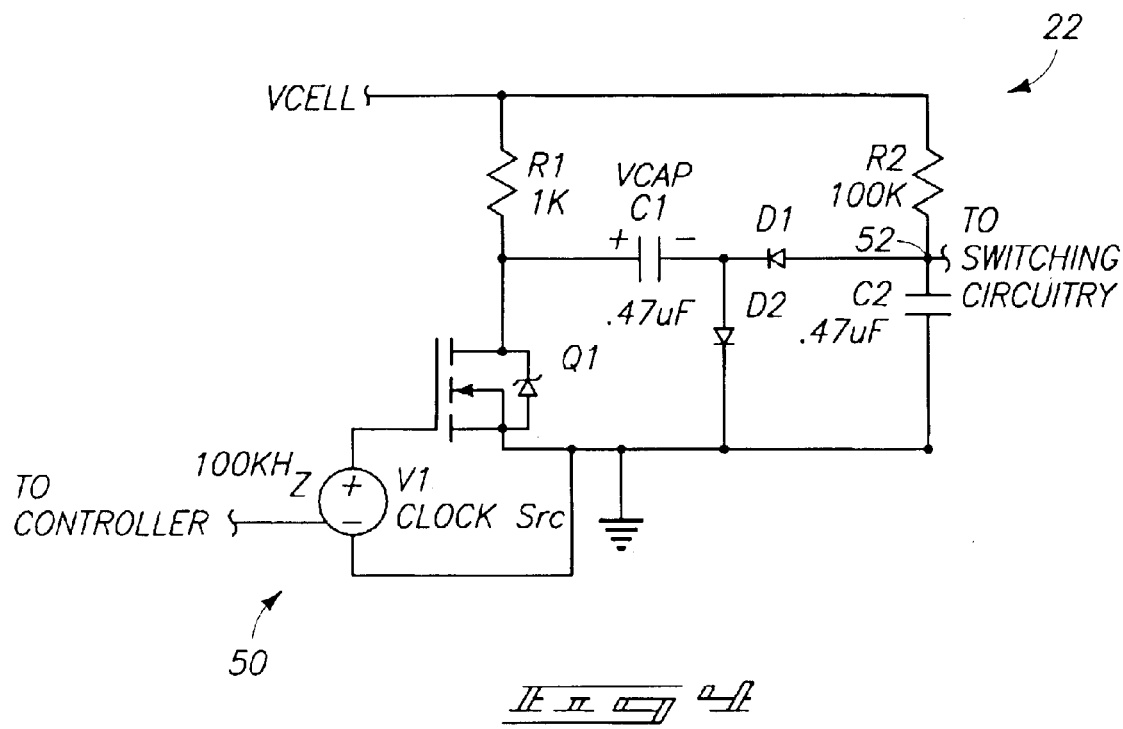
_Fig. 4_
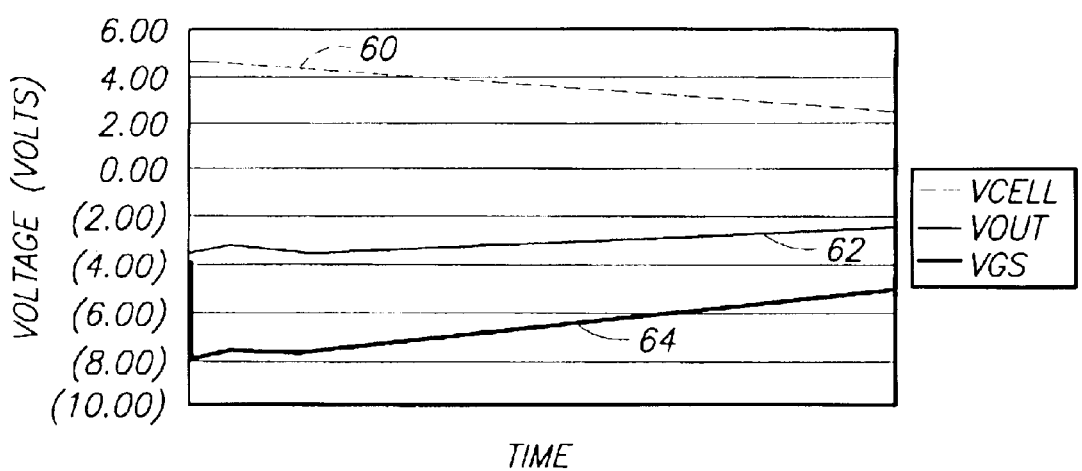
_Fig. 5_

POWER SUPPLY APPARATUSES AND POWER SUPPLY OPERATIONAL METHODS

TECHNICAL FIELD

This invention relates to power supply apparatuses and power supply operational methods.

BACKGROUND OF THE INVENTION

Electrochemical devices are utilized in an increasing number of applications, such as personal digital assistants (PDAs), mobile telephone devices, notebook computers, electronic gaming devices, music players, etc. Electrochemical devices which are rechargeable are typically utilized in conjunction with some form of charge and discharge control. Some control implementations utilize one or more power MOSFET to provide charging and/or discharging of an electrochemical device. When a power FET is enabled, the channel resistance is a function of the voltage applied between the gate and the source ($V_{gs}$) of the FET. A lower resistance is provided with increasing $V_{gs}$ voltages. During high rates of discharge of the electrochemical device or when the charge of the electrochemical device voltage has degraded a sufficient amount, the "on" resistance of the power FET switching device increases. Such causes the voltage on the battery terminal to be lowered by an amount equal to the load current times the channel resistance ($R_{dson}$ for drain to source resistance) for the power MOSFET(s).

Electrochemical devices are typically used in applications having specific parameters for proper operation. An often overlooked issue in safety circuits in such applications is the total impedance due to the channel resistance ($R_{dson}$) of the power MOSFETs used to control charge and discharge currents. The total $R_{dson}$ of a power MOSFET is related to the voltage applied between the gate and the source of the FET ($V_{gs}$), the current through the device, and the temperature of the device. As the voltage of the electrochemical device falls, $V_{gs}$ applied to the gate is diminished which in turn causes $R_{dson}$ to increase. Decreasing voltage of the electrochemical device also corresponds to a higher current to the load in as much as power consumption is assumed to be constant (i.e., VI is a constant quantity). From an external device perspective, such results in a lower voltage due to the drop across the power MOSFET and an additional power loss equal to $I^2 R_{dson}$. The additional power loss is translated into heat which also causes the channel resistance to increase.

Customers or engineers of applications utilizing electrochemical devices account for such performance degradation by setting cut-off voltages for the electrochemical devices at abnormally high levels to assure proper operation. Improved apparatuses and methodologies for providing electrical energy which alleviate problems of arrangements utilizing abnormally high cut-off voltages are desired.

BRIEF DESCRIPTION OF THE DRAWINGS

Preferred embodiments of the invention are described below with reference to the following accompanying drawings.

FIG. 4 is a schematic representation of exemplary conditioning circuitry of FIG. 2.

FIG. 5 is a graphical representation depicting exemplary voltages of the circuit schematic of FIG. 4 during operations.

DETAILED DESCRIPTION OF THE PREFERRED EMBODIMENTS

Figure 1:
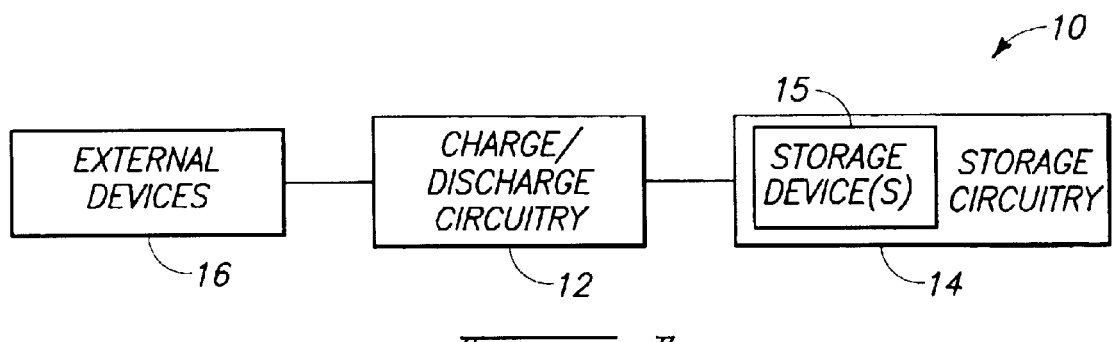
FIG. 1 is a functional block diagram of an exemplary power supply apparatus.

This disclosure of the invention is submitted in furtherance of the constitutional purposes of the U.S. Patent Laws "to promote the progress of science and useful arts" (Article 1, Section 8).

According to one aspect of the invention, a power supply apparatus comprises a power node, an electrochemical device configured to store electrical energy, a switch including a control node and the switch is adapted to electrically couple the electrochemical device with the power node in a conducting state and to substantially electrically isolate the electrochemical device and the power node in a nonconducting state, a controller configured to output a first control signal to control the operation of the switch between the conducting state and the nonconducting state and circuitry coupled with the controller and the control node and configured to receive electrical energy at a first voltage magnitude, to increase the electrical energy to a second voltage magnitude greater than the first voltage magnitude to provide a second control signal, and to output the second control signal of the second voltage magnitude to the switch.

According to a second aspect of the invention, a power supply apparatus comprises an electrochemical device configured to provide electrical energy at a first voltage magnitude in a substantially charged state, circuitry configured to provide a control signal with a second voltage magnitude greater than the first voltage magnitude and a switch configured to selectively electrically couple the electrochemical device with a power node adapted to receive electrical energy to charge the electrochemical device during one moment in time and to output electrical energy from the electrochemical device to a load during another moment in time, the switch being configured to selectively electrically couple responsive to the control signal.

According to another aspect of the invention, a power supply apparatus comprises circuitry configured to receive electrical energy and to increase a voltage magnitude of the electrical energy to provide a control signal and a switch including a control node adapted to couple with the circuitry, a first terminal adapted to couple with a power node and a second terminal adapted to couple with an electrochemical device, wherein the switch is configured to electrically couple the first terminal and the second terminal at one moment in time responsive to the control signal and to substantially electrically insulate the first terminal and the second terminal at another moment in time responsive to the control signal.

According to yet another aspect of the invention, a power supply operational method comprises providing an electrochemical device configured to provide electrical energy at a first voltage magnitude in a substantially charged state, providing a control signal including a second voltage magnitude greater than the first voltage magnitude of the electrical energy of the electrochemical device and conducting electrical energy at least one of into and from the electrochemical device responsive to the providing the control signal including the second voltage magnitude.

According to another aspect of the invention, a power supply operational method comprises providing a switch intermediate an electrochemical device and a power node, providing a control signal to control the operation of the switch between a conducting state and a nonconducting state, the providing the control signal comprising increasing a voltage magnitude of the electrical energy from the electrochemical device and applying the control signal to the switch.

According to yet another aspect of the invention, a power supply operational, method comprises providing a switch coupled with a power node and an electrochemical device, generating a control signal to control the switch to operate between an open state and a closed state to selectively electrically couple the power node and the electrochemical device, inverting electrical energy from the electrochemical device responsive to the control signal, increasing a voltage magnitude of the electrical energy responsive to the control signal and applying the electrical energy to the switch after the inverting and the increasing.

According to still another aspect of the invention, a power supply operational method comprises providing a battery including a single electrochemical cell configured to provide electrical energy at a first voltage magnitude in a substantially charged state, wherein the electrochemical cell comprises a lithium cell having a lithium mixed metal electrode, providing a power node adapted to electrically couple with an external electrical supply during charging operations of the battery and a load during discharging operations of the battery, providing a p-channel field effect transistor electrically coupled intermediate the power node and the battery, monitoring the charging operations and the discharging operations using a controller, providing the electrical energy to the controller, outputting a control signal comprising the electrical energy using the controller and responsive to the monitoring, receiving the control signal using a negative voltage regulator, inverting the electrical energy using the negative voltage regulator, increasing a voltage magnitude of the electrical energy using the negative voltage regulator to a second voltage magnitude greater than the first voltage magnitude and applying the electrical energy after the inverting and the increasing to a gate of the p-channel field effect transistor to control coupling of the power node with the battery.

FIG. 1 illustrates an exemplary power supply apparatus 10 according to illustrative aspects of the present invention. The depicted power supply apparatus 10 comprises a rechargeable device including charge/discharge circuitry 12 coupled with storage circuitry 14.

As shown, charge/discharge circuitry 12 is additionally arranged to couple with external devices 16. Circuitry 12 is arranged to charge storage circuitry 14 using electrical energy from external devices 16 during charging operations of apparatus 10, and to supply electrical energy from storage circuitry 14 to external devices 16 during discharging operations of apparatus 10.

In the described exemplary implementation, and during charging operations of apparatus 10, external devices 16 include an electrical energy source which may be implemented as an any convenient supply of electrical energy, such as a utility line, generator, alternator, etc. In some arrangements, a rectifier may be utilized to provide direct current electrical energy if the supply is arranged to provide alternating current electrical energy. During discharging operations of apparatus 10, circuitry 12 may be disconnected from an external device 16 comprising an electrical energy charging supply and coupled with a load configured to receive stored electrical energy from storage circuitry 14. Alternatively, circuitry 12 is simultaneously coupled with devices 16 including a supply and a load.

Accordingly, power supply apparatus 10 is configured to store electrical energy for use in external devices 16 comprising associated loads. For example, power supply apparatus 10 may be utilized to provide electrical energy to loads including portable electronic devices, such as mobile telephones, notebook computers, music players, personal digital assistants (PDAs) or any other devices which utilize electrical energy.

Storage circuitry 14 includes one or more storage device 15 configured as a battery and arranged to store electrical energy. The storage device(s) 15 may be individually implemented as an electrochemical device in one possible arrangement. Circuitry of the present invention is advantageously utilized in arrangements wherein storage circuitry 14 includes a single storage device 15, such as a single electrochemical cell configured as a battery. Other possible battery configurations for other applications include a plurality of devices 15, such as a plurality of electrochemical cells arranged in series and/or parallel.

Exemplary configurations of storage device(s) 15 which may be utilized within storage circuitry 14 include electrochemical cell(s) comprising lithium cell(s) individually having a lithium-mixed metal electrode. Further details regarding an exemplary lithium cell having a lithium-mixed metal electrode are discussed in U.S. patent application Ser. No. 09/484,799, entitled "Lithium-Based Active Materials and Preparation Thereof", listing Jeremy Barker as an inventor, filed Jan. 18, 2000, assigned to the assignee of the present invention, and incorporated herein by reference. Storage device(s) 15 include other configurations in other embodiments.

A single lithium cell having a lithium-mixed metal electrode is configured in at least one arrangement to provide a voltage of approximately 3.7 Volts in a substantially charged state or condition and has a nominal voltage range of 2.7–3.7 Volts. A storage device 15 implemented in an alternative configuration as a LCO cell has a nominal voltage range of 2.9–4.2 Volts. Storage circuitry 14 may comprise other electrical energy storage arrangements in other configurations.

Figure 2:
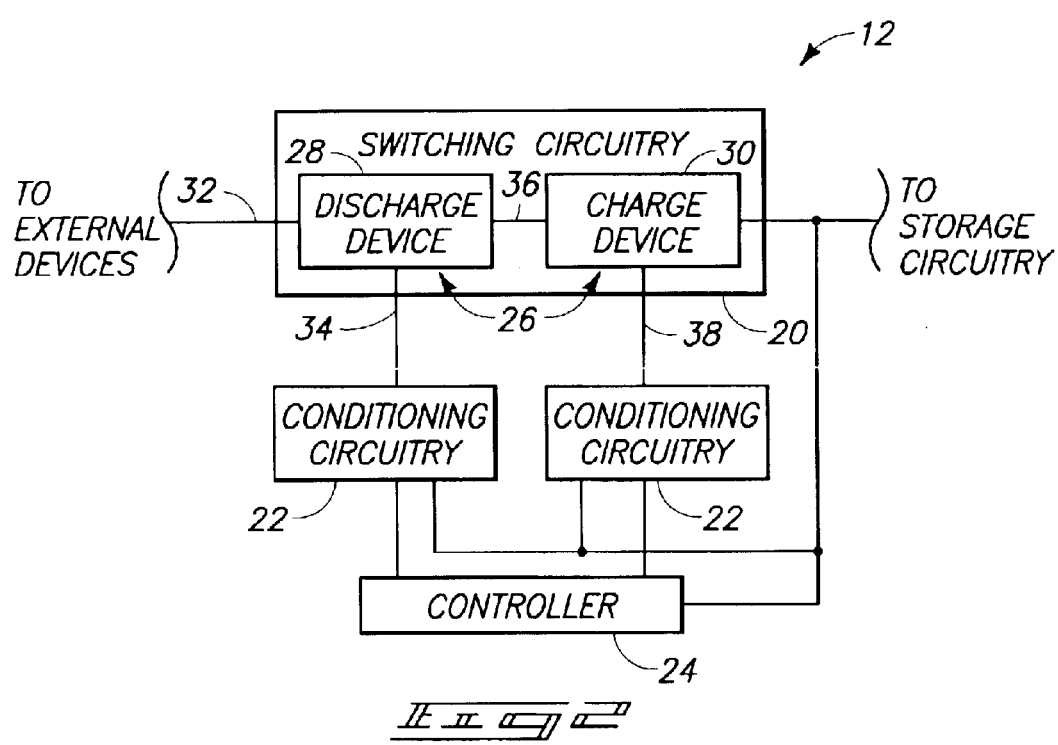
FIG. 2 is a functional block diagram depicting components of an exemplary charge/discharge circuit of the power supply apparatus.

Referring to FIG. 2, an exemplary charge/discharge circuit 12 is shown. The illustrated charge/discharge circuitry 12 includes switching circuitry 20, a plurality of conditioning circuits 22, and a controller 24 in accordance with the exemplary embodiment.

Switching circuitry 20 is arranged to electrically couple with external devices 16 and storage circuitry 14. In the depicted embodiment, switching circuitry 20 includes a plurality of series arranged switches 26 implemented as a discharge device 28 and a charge device 30. Responsive to respective received control signals, switches 26 are operable to selectively electrically couple external devices 16 with storage circuitry 14 according to a control methodology implemented by controller 24 during charge operations and discharge operations.

In the described exemplary embodiment, switches 26 comprise power metal oxide semiconductor field effect transistors (FETs) implemented as p-channel devices in the depicted exemplary embodiment. Switches 26 implemented as p-channel power MOSFETs are available from Fairchild Semiconductor having part number FDS6675. Other devices or configurations of switches 26 may be utilized.

Switches 26 individually include a control node and at least one power node. For example, discharge device 28 includes a power node 32 configured to couple with external devices 16, and a control node 34 coupled with a respective conditioning circuit 22 and controller 24. Charge device 30 includes a power node 36 configured to couple with external devices 16 via discharge device 28, and a control node 38 also coupled with a respective conditioning circuit 22 and controller 24. Control nodes 34, 38 operate to provide respective control signals to gates of devices 28, 30 which individually control the operation of respective devices 28, 30 between an open state and a closed state to selectively electrically couple the respective power nodes 32, 36 and storage circuitry 14 or power node 32 and power node 36.

Accordingly, switches 26 are individually configured to electrically couple storage device(s) 15 of storage circuitry 14 with a respective power node 32, 36 in a conducting state and to substantially electrically isolate storage device(s) 15 and the respective power node 32, 36 in a non-conducting state. Switches 26 are configured to selectively electrically couple storage device(s) 15 with the respective power node 32, 36 which is adapted to receive electrical energy to charge storage device(s) 15 during one moment in time and to output electrical energy from the storage device(s) 15 to a load during another moment in time. In accordance with the above, switches 26 comprising discharge device 2B and charge device 30 implement discharging and charging operations of storage device(s) 15.

Figure 3:
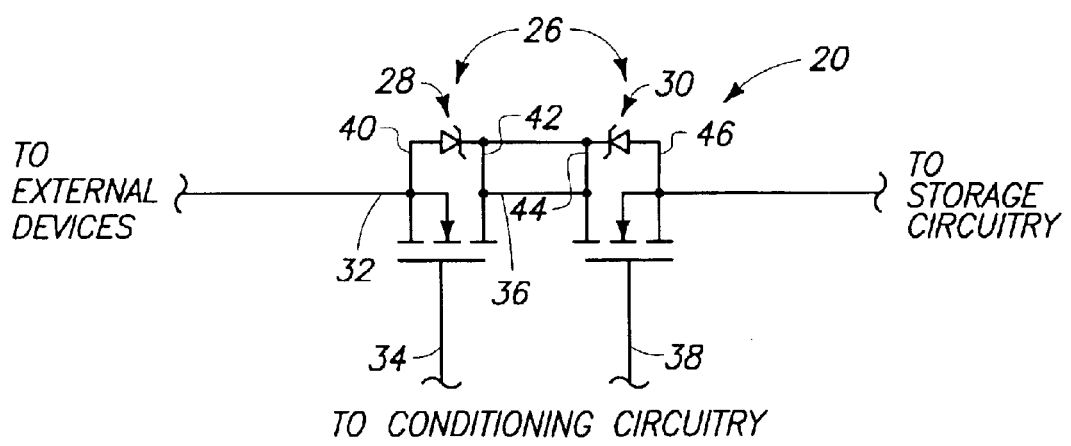
FIG. 3 is a schematic representation of exemplary switching circuitry of FIG. 2.

Referring to FIG. 3, further details regarding an exemplary configuration of switching circuitry 20 are shown. In the described exemplary embodiment of FIG. 3, switches 26 are implemented in a back-to-back relationship to implement discharging and charging operations and prevent undesired conduction through the respective body diodes. Switching circuitry 20 of the exemplary embodiment includes two switches 26 arranged in series and implemented as p-channel power FETs, and comprising discharge device 28 and charge device 30. Discharge device 28 includes a first terminal 40 and a second terminal 42 and charge device 30 includes a first terminal 44 and a second terminal 46. First terminals 40, 44 are adapted to couple with respective power nodes 32, 36 and second terminals 42, 46 are adapted to couple with storage device(s) 15 of storage circuitry 14 (i.e., second terminal 42 of device 28 is selectively coupled with storage device(s) 15 via device 30 in the illustrated exemplary arrangement). In other embodiments, a single switch 26 may be utilized between devices 16 and circuitry 14.

Control nodes 34, 38 of respective switches 26 are adapted to couple with respective ones of conditioning circuits 22 and controller 24 and to receive control signals therefrom. As illustrated, control nodes 34, 38 are electrically coupled with respective gates of switches 26. Individual switches 26 are configured to electrically couple respective first terminals 40, 44 and respective second terminals 42, 46 at one moment in time responsive to control signals from a respective circuit 22 and controller 24, and to substantially electrically insulate the respective first terminals 40, 44 and the respective second terminals 42, 46 at another moment in time responsive to the control signals from a respective circuit 22 and controller 24. It is also possible for only one of switches 28, 30 to be "on" or conducting at a given moment in time.

Referring again to FIG. 2, controller 24 is configured to monitor and control charging, discharging and maintenance operations of storage circuitry 14. An exemplary controller is implemented as a battery micro-controller, such as a model M37515 or M37516 available from Mitsubishi Electric and Electronics USA, Inc.

At least during some operations, controller 24 derives electrical energy from electrochemical device(s) 15 of storage circuitry 14 according to but one embodiment. Controller 24 monitors one or more electrical condition (e.g. state, of charge) of storage device(s) 15 and provides control signals to conditioning circuitry 22 and switching circuitry 20 responsive to the monitoring. Controller 24 is arranged to output plural respective control signals to control the operation of respective switches 26 between conducting states and non-conducting states. In at least one configuration, controller 24 is configured to utilize electrical energy from storage device(s) 15 to formulate the control signals, and perhaps, for operational power.

Conditioning circuits 22 are coupled intermediate controller 24 and respective control nodes 34, 38 of switches 26 of switching circuitry 20. As described above, controller 24 is arranged to receive electrical energy from storage device (s) 15 of storage circuitry 14 in at least one embodiment. Controller 24 is configured to formulate or generate control signals to control switching circuitry 20 and the control signals selectively have logic low and logic high states to control the operation of switches 26. In one embodiment, control signals outputted from controller 24 have a voltage magnitude substantially equal to a voltage magnitude of electrical energy of storage device(s) 15 during one state (e.g., logic high) and a zero voltage magnitude during another state (e.g., logic low). According to an exemplary embodiment where storage circuitry 14 includes a single storage device 15, control signals generated by controller 24 have a voltage magnitude substantially equal to a voltage magnitude of electrical energy provided by storage device 15 in logic high states. Other control signals and protocols are possible.

Conditioning circuits 22 are configured to electrically condition electrical energy from storage circuitry 14, or other appropriate source, according exemplary aspects. In one embodiment, conditioning circuits 22 are configured to increase a voltage magnitude of electrical energy having, for example a voltage magnitude of storage circuitry 14, to provide control signals individually having an increased voltage magnitude in logic high states to provide switches 26 in enhanced operational modes. For example, if the received electrical energy has a voltage magnitude of approximately 3.7 Volts, conditioning circuits 22 are individually configured to double the voltage magnitude and output the control signal having a voltage magnitude of approximately 7.4 Volts in one exemplary embodiment. Accordingly, in one embodiment, conditioning circuits 22 are individually configured to receive electrical energy at a first voltage magnitude, to increase a voltage magnitude of the electrical energy to a second voltage magnitude greater than the first voltage magnitude, and to output control signals of the second voltage magnitude to switching circuitry 20.

According to additional exemplary aspects, conditioning circuits 22 are arranged to invert the voltage of received electrical energy. For example, conditioning circuits 22 are individually implemented as a negative voltage regulator to provide inversion operations of the electrical energy, and to increase the voltage magnitude of the electrical energy as described above. Aspects of the invention to increase the voltage magnitude of the electrical energy and to invert the voltage of the electrical energy in the described p-channel arrangement of switches 26, provide control signals which assure that the $R_{dson}$ of the switches 26 is minimized, and that the respective switches 26 controlled thereby are provided in an enhanced mode of operation to minimize power losses in charge/discharge circuitry 12.

Other arrangements of conditioning circuits 22 are possible. For example, if switches 26 are implemented as n-channel devices, it may be desired to increase the voltage magnitude for outputted control signals for such devices without performing inversion operations. Alternatively, controller 24 or other circuitry may be arranged to perform inversion operations of generated control signals for switches 26 comprising p-channel devices, and respective conditioning circuits 22 are utilized to increase the voltage magnitude of the control signals to provide operation of switches 26 in an enhanced mode.

Referring to FIG. 4, one exemplary embodiment of a conditioning circuit 22 according to aspects of the invention is depicted (plural parallel circuits 22 are provided in FIG. 3). The illustrated configuration of conditioning circuitry 22 comprises a negative voltage regulator. Other configurations of conditioning circuitry 22 are possible as mentioned above.

The illustrated conditioning circuit 22 includes a clock generator 50 and a node 52. Clock generator 50 is coupled with controller 24 and is configured to receive outputted control signals from controller 24. Node 52 is adapted to apply control signals from a respective circuit 22 to switching circuitry 20.

In the absence of a control signal from controller 24 (e.g., the control signal from controller 24 is 0 Volts), clock generator 50 is off and output node 52 is provided at a voltage $V_{cell}$ corresponding to a voltage of storage device(s) 15 of storage circuitry 14 in the described exemplary embodiment minus a voltage drop across resistor R2. In the presence of the control signal from controller 24 (e.g., the control signal from controller 24 is 3.7 Volts in an exemplary arrangement), clock generator 50 is enabled and conditioning circuit 22 operates to invert electrical energy (e.g., $V_{cell}$ electrical energy) and to increase the voltage magnitude of the electrical energy (e.g., $V_{cell}$ electrical energy) from a first voltage magnitude (e.g., 3.7 Volts) to a second voltage magnitude (e.g., 7.4 Volts). Accordingly, control signals outputted via node 52 have an increased voltage magnitude and inverted voltage polarity compared to electrical energy from circuitry 14 (e.g., $V_{cell}$ electrical energy) and control signals received from controller 24 within circuitry 22.

Referring to FIG. 5, a graphical representation of voltages of circuitry of FIG. 4 versus time are shown for an apparatus 10 having a storage device 15 implemented as a LCO cell. In particular, FIG. 5 depicts a Spice™ simulation of the gate drive signaling over typical cell voltages to show effective gate drive as the voltage of storage circuitry 14 decreases. Line 60 represents a voltage magnitude of $V_{cell}$ electrical energy corresponding to a single storage device 15. Line 62 represents a voltage magnitude of $V_{out}$ at node 52. Line 64 represents a voltage magnitude at node 52 corresponding to outputted control signals for application to a respective switch 26.

The depicted negative voltage regulator provides a voltage $V_{cap}$ equal to $V_{cell}$ minus $V_d$ (where $V_d$ is the forward voltage of diode D1). When the FET Q, is enabled, the voltage at the positive terminal of capacitor C1 falls to ground potential which also results in a voltage drop of the same magnitude at the negative terminal of capacitor C1. The voltage in node 52 falls to $-(V_{cell}-2V_d)$ and remains due to reverse biasing of diode D1 when capacitor C1 is stabilizing. Capacitor C2 operates to smooth the voltage of the output control signal at node 52.

The arrangement of FIG. 4 including the depicted components provides the advantage of not occupying significant real estate if implemented on a printed circuit board. The depicted circuitry may be utilized as a p-channel gate drive considering the small current and limited associated power. Further, the depicted circuit arrangement minimizes dissipation when switches 26 are off and also takes advantage of existing control schemes. Aspects of the invention provide increased voltage magnitudes of two times the received electrical energy voltage corresponding to the storage circuitry 14 (e.g., $V_{cell}$ in single cell applications) as opposed to other devices which at best provide a $V_{gs}$ threshold of the cell or received voltage.

The depicted conditioning circuitry 22 is operable to drive switches 26 inasmuch as the gates of such implemented as field effect transistors have effectively no load and resistor R2 does not sufficiently impact the circuitry of FIG. 4. In the illustrated embodiment, the worst case voltage has a magnitude greater than −4.5 Volts as shown in the trace $V_{gs}$ which provides improved results than a best case solution in circuitry providing magnitudes of $-V_{cell}$. As described herein, exemplary circuitry according to aspects of the present invention use a negative and increased voltage to insure that switches 26 implemented as p-channel field effect transistors are fully enhanced regardless of cell or supply voltage.

In another arrangement, a negative rail could be utilized to switch devices 26 on and off in less time. However, speed limitations of the circuitry depicted in FIG. 4 is not significant for controlling switches 26.

In compliance with the statute, the invention has been described in language more or less specific as to structural and methodical features. It is to be understood; however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A power supply apparatus comprising:
   a power node;
   an electrochemical device configured to store electrical energy;
   a switch including a control node-and the switch is adapted to electrically couple the electrochemical device with the power node in a conducting state and to substantially electrically isolate the electrochemical device and the power node in a nonconducting state;
   a controller configured to output a first control signal to control the operation of the switch between the conducting state and the nonconducting state; and
   circuitry coupled with the controller and the control node and configured to receive electrical energy at a first voltage magnitude, to increase the electrical energy to a second voltage magnitude greater than the first voltage magnitude to provide a second control signal, and to output the second control signal of the second voltage magnitude to the switch.

2. The apparatus of claim 1 wherein the electrochemical device comprises a single cell battery.

3. The apparatus of claim 1 wherein the electrochemical device comprises a lithium cell having a lithium-mixed metal electrode.

4. The apparatus of claim 1 wherein the circuitry is further configured to invert a voltage of the electrical energy to provide the second control signal.

5. The apparatus of claim 1 wherein the circuitry comprises a negative voltage regulator.

6. The apparatus of claim 1 wherein the controller is configured to receive the electrical energy from the electrochemical device.

7. The apparatus of claim 6 wherein the controller is configured to utilize electrical energy from the electrochemical device to formulate the first control signal including the first voltage magnitude.

8. The apparatus of claim 1 wherein the controller is configured to monitor at least one electrical condition of the electrochemical device and to output the first control signal responsive to the monitoring.

9. The apparatus of claim 1 wherein the power node is adapted to electrically couple with at least one of an electrical supply and a load.

10. A power supply apparatus comprising:
an electrochemical device configured to provide electrical energy at a first voltage magnitude in a substantially charged state;
circuitry configured to provide a control signal with a second voltage magnitude greater than the first voltage magnitude; and
a switch configured to selectively electrically couple the electrochemical device with a power node adapted to receive electrical energy to charge the electrochemical device during one moment in time and to output electrical energy from the electrochemical device to a load during another moment in time, the switch being configured to selectively electrically couple responsive to the control signal.

11. The apparatus of claim 10 wherein the electrochemical device comprises a single cell battery.

12. The apparatus of claim 10 wherein the electrochemical device comprises a lithium cell having a lithium-mixed metal electrode.

13. The apparatus of claim 10 wherein the circuitry is configured to increase a voltage magnitude of the electrical energy from the electrochemical device to provide the control signal of the second voltage magnitude.

14. The apparatus of claim 13 wherein the circuitry is configured to invert a voltage of the electrical energy.

15. The apparatus of claim 10 wherein the circuitry is configured to invert a voltage of the electrical energy to provide the control signal.

16. The apparatus of claim 10 wherein the circuitry comprises a negative voltage regulator.

17. The apparatus of claim 10 wherein the switch comprises a p-channel field effect transistor.

18. The apparatus of claim 10 wherein the switch comprises one of a charge device and discharge device.

19. A power supply apparatus comprising:
circuitry configured to receive electrical energy and to increase a voltage magnitude of the electrical energy to provide a control signal; and
a switch including a control node adapted to couple with the circuitry, a first terminal adapted to couple with a power node and a second terminal adapted to couple with an electrochemical device, wherein the switch is configured to electrically couple the first terminal and the second terminal at one moment in time responsive to the control signal and to substantially electrically insulate the first terminal and the second terminal at another moment in time responsive to the control signal.

20. The apparatus of claim 19 further comprising the electrochemical device comprising a single cell battery.

21. The apparatus of claim 19 wherein the circuitry is configured to receive the electrical energy from the electrochemical device.

22. The apparatus of claim 19 wherein the circuitry is configured to receive the electrical energy from the electrochemical device comprising a single cell battery.

23. The apparatus of claim 22 wherein the electrochemical device comprises a lithium cell having a lithium-mixed metal electrode.

24. The apparatus of claim 19 wherein the circuitry is configured to invert a voltage of the electrical energy.

25. The apparatus of claim 19 wherein the circuitry comprises a negative voltage regulator.

26. The apparatus of claim 19 wherein the switch comprises a p-channel field effect transistor.

27. The apparatus of claim 19 wherein the switch comprises one of a charge device and a discharge device.

28. A power supply operational method comprising:
providing an electrochemical device configured to provide electrical energy at a first voltage magnitude in a substantially charged state;
providing a control signal including a second voltage magnitude greater than the first voltage magnitude of the electrical energy of the electrochemical device; and
conducting electrical energy at least one of into and from the electrochemical device responsive to the providing the control signal including the second voltage magnitude.

29. The method of claim 28 wherein the electrochemical device comprises a single cell battery.

30. The method of claim 28 wherein the electrochemical device comprises a lithium cell having a lithium-mixed metal electrode.

31. The method of claim 28 wherein the providing the control signal comprises providing the control signal using electrical energy from the electrochemical device.

32. The method of claim 28 wherein the providing the control signal comprises increasing the voltage magnitude of the electrical energy.

33. The method of claim 28 wherein the providing the control signal comprises inverting the electrical energy.

34. The method of claim 28 wherein the providing the control signal comprises increasing the voltage magnitude of the electrical energy and inverting the electrical energy.

35. A power supply operational method comprising:
providing a switch intermediate an electrochemical device and a power node;
providing a control signal to control the operation of the switch between a conducting state and a nonconducting state, the providing the control signal comprising increasing a voltage magnitude of the electrical energy from the electrochemical device; and;
applying the control signal to the switch.

36. The method of claim 35 further comprising providing the electrochemical device comprising a single cell battery.

37. The method of claim 36 wherein the electrochemical device comprises a lithium cell having a lithium-mixed metal electrode.

38. The method of claim 35 wherein the providing the control signal further comprises inverting a voltage of the electrical energy before the applying.

39. The method of claim 38 wherein the applying comprises applying at one moment in time; and further comprising applying the electrical energy without the increasing and the inverting at another moment in time.

40. The method of claim 35 wherein the providing the switch comprises providing a p-channel field effect transistor, and the applying comprises applying the control signal to a gate of the field effect transistor.

41. A power supply operational method comprising:
providing a switch coupled with a power node and an electrochemical device;
generating a control signal to control the switch to operate between an open state and a closed state to selectively electrically couple the power node and the electrochemical device;

inverting electrical energy from the electrochemical device responsive to the control signal;

increasing a voltage magnitude of the electrical energy responsive to the control signal; and applying the electrical energy to the switch after the inverting and the increasing.

42. The method of claim 41 further comprising providing the electrochemical device comprising a single cell battery.

43. The method of claim 42 wherein the electrochemical device comprises a lithium cell having a lithium-mixed metal electrode.

44. The method of claim 41 wherein the providing the switch comprises providing a p-channel field effect transistor, and the applying comprises applying the electrical energy to agate of the field effect transistor.

45. The method of claim 41 further comprising monitoring at least one electrical condition of the electrochemical device and wherein the generating is responsive to the monitoring.

46. The method of claim 41 wherein the generating comprises generating using a controller, and further comprising providing the electrical energy to the controller using the electrochemical device.

47. A power supply operational method comprising:

providing a battery including a single electrochemical cell configured to provide electrical energy at a first voltage magnitude in a substantially charged state, wherein the electrochemical cell comprises a lithium cell having a lithium-mixed metal electrode;

providing a power node adapted to electrically couple with an external electrical supply during charging operations of the battery and a load during discharging operations of the battery;

providing a p-channel field effect transistor electrically coupled intermediate the power node and the battery;

monitoring the charging operations and the discharging operations using a controller;

providing the electrical energy to the controller;

outputting a control signal comprising the electrical energy using the controller and responsive to the monitoring;

receiving the control signal using a negative voltage regulator;

inverting the electrical energy using the negative voltage regulator;

increasing a voltage magnitude of the electrical energy using the negative voltage regulator to a second voltage magnitude greater than the first voltage magnitude; and applying the electrical energy after the inverting and the increasing to a gate of the p-channel field effect transistor to control coupling of the power node with the battery.

* * * * *